(12) United States Patent
Kim (10) Patent No.: US 10,429,029 B2
(45) Date of Patent: Oct. 1, 2019

(54) ORGANIC LIGHT EMITTING DISPLAY DEVICE AND METHOD FOR FABRICATING THE SAME

(71) Applicant: LG Display Co., Ltd., Seoul (KR)

(72) Inventor: Byong Hoo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 289 days.

(21) Appl. No.: 13/725,147

(22) Filed: Dec. 21, 2012

(65) Prior Publication Data
US 2013/0163255 A1    Jun. 27, 2013

(30) Foreign Application Priority Data

Dec. 23, 2011 (KR) .................. 10-2011-0141074

(51) Int. Cl.
| | | |
|---|---|---|
| B32B 27/00 | (2006.01) | |
| B32B 27/08 | (2006.01) | |
| F21V 3/06 | (2018.01) | |
| H01L 51/52 | (2006.01) | |
| C09J 175/16 | (2006.01) | |
| C08F 220/18 | (2006.01) | |

(52) U.S. Cl.
CPC ............ *F21V 3/062* (2018.02); *C09J 175/16* (2013.01); *H01L 51/524* (2013.01); *H01L 51/5237* (2013.01); *H01L 51/5246* (2013.01); *C08F 2220/1875* (2013.01)

(58) Field of Classification Search
None
See application file for complete search history.

(56) References Cited

U.S. PATENT DOCUMENTS

| | | | | |
|---|---|---|---|---|
| 2005/0209360 | A1* | 9/2005 | Graichen et al. ............. | 522/178 |
| 2007/0123653 | A1* | 5/2007 | Attarwala et al. ............ | 525/167 |
| 2007/0138411 | A1* | 6/2007 | Konarski ............ | C08F 290/067 |
| | | | | 250/492.1 |
| 2009/0009046 | A1* | 1/2009 | Oh et al. ............................ | 313/1 |
| 2010/0212824 | A1* | 8/2010 | Lionberger .......... | C09D 133/08 |
| | | | | 156/275.5 |
| 2010/0304482 | A1* | 12/2010 | Deshayes .................. | C08F 2/32 |
| | | | | 435/366 |
| 2011/0073171 | A1* | 3/2011 | Pickett .......................... | 136/255 |

(Continued)

FOREIGN PATENT DOCUMENTS

| | | | | |
|---|---|---|---|---|
| KR | 10-2005-0021977 A | | 3/2005 | |
| WO | WO-2011115058 A1 * | | 9/2011 | ............ C08F 265/06 |

OTHER PUBLICATIONS

Henkel, Loctite: Design Guide for Bonding Plastics, vol. 6, p. 1-100, 2011.*

*Primary Examiner* — Coris Fung
(74) *Attorney, Agent, or Firm* — Birch, Stewart, Kolasch & Birch, LLP (57) ABSTRACT

An OLED device is discussed. The OLED device includes: a board assembly configured to include organic light emission elements; a plastic cover attached to the board assembly; and an adhesive layer filled between the board assembly and the plastic cover. The adhesive layer is formed from an adhesive composition which includes 50~95 parts by weight of an acryl-based copolymer resin, 4.7~44 parts by weight of an acryl monomer, 0.1~2 parts by weight of a cross linking monomer, 0.1~2 parts by weight of a visible light initiator, and 0.1~2 parts by weight of an additive.

15 Claims, 4 Drawing Sheets

(56) References Cited

U.S. PATENT DOCUMENTS

| | | | | |
|---|---|---|---|---|
| 2011/0092612 A1* | 4/2011 | Miki | ................... | C07D 307/91 |
| | | | | 522/154 |
| 2011/0186871 A1* | 8/2011 | Vaufrey | ............... | H01L 51/524 |
| | | | | 257/88 |
| 2011/0218267 A1* | 9/2011 | Shinano | ................... | C09K 3/10 |
| | | | | 522/66 |
| 2013/0003389 A1* | 1/2013 | Moroishi | .............. | C08F 265/06 |
| | | | | 362/311.01 |
| 2013/0324309 A1* | 12/2013 | Kennedy, III | ......... | A63B 45/02 |
| | | | | 473/351 |

* cited by examiner

ORGANIC LIGHT EMITTING DISPLAY DEVICE AND METHOD FOR FABRICATING THE SAME

The present application claims priority under 35 U.S.C. § 119(a) of Korean Patent Application No. 10-2011-0141074 filed on Dec. 23, 2011, which is hereby incorporated by reference in its entirety.

BACKGROUND

Field of the Disclosure

The present application relates to an organic light emitting display (OLED) device, and more particularly to an OLED device adapted to simultaneously enhance the adhesive strength and the visibility (or visual recognizablity) and a method of fabricating the same.

Description of the Related Art

Nowadays, as the information society grows, display devices have been rapidly developed. Among the display devices, OLED devices are a self-illuminating display device not requiring a backlight unit. As such, the OLED devices can become thinner. Also, the OLED devices can have low power consumption.

Accordingly, the OLED devices have been mainly used for portable terminals such as mobile phones, notebook computers, navigation systems and so on.

Such an OLED device can include a board assembly and a cover. The board assembly can include organic light emission elements formed on a substrate and a seal substrate combined with the substrate having the organic light emission elements. The cover has a function of protecting an upper surface of the board assembly which can be exposed to the exterior.

In order to buffer external impacts, the board assembly and the cover according to the related art are combined to have a spaced distance, i.e., an air gap, therebetween. The air gap has a refractive index different from those of the board assembly and the cover. As such, external light entering the upper surface of the OLED device can be reflected or refracted by an inner surface of the cover or the board assembly which comes in contact with the air gap. In other words, the air gap has a function of enhancing external impacts, but causes the visibility (or visual recognizability) of the OLED device to deteriorate.

The cover can be formed from one of glass or plastic materials. The plastic cover has superior durability and light weight compared to the glass cover. As such, the plastic cover is profitably applied to a portable display device. However, the plastic cover deforms easily in lateral directions by UV (ultra violet) light.

To address this matter, the plastic cover contains a UV blocker. In this case, the UV blocker contained in the plastic cover can prevent the hardening of an adhesive layer by shielding UV light which is necessary to harden the adhesive layer. This results from the fact that the adhesive layer can be hardened by UV light. Due to this, the adhesive layer must be incompletely hardened, and furthermore causes the adhesive strength between the plastic cover and the board assembly.

BRIEF SUMMARY

Accordingly, the present application is directed to an OLED device that substantially obviates one or more of problems due to the limitations and disadvantages of the related art, and to a method of manufacturing the same, to a method of fabricating the same.

An object of the present embodiments is to provide an OLED device and a manufacturing method thereof that are adapted to simultaneously enhance the adhesive strength and the visibility (or visual recognizablity) by filling an adhesive layer in an air gap between a plastic cover and a board assembly.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an OLED device includes: a board assembly configured to include organic light emission elements; a plastic cover attached to the board assembly; and an adhesive layer filled between the board assembly and the plastic cover and formed from an adhesive composition which includes 50~95 parts by weight of an acryl-based copolymer resin, 4.7~44 parts by weight of an acryl monomer, 0.1~2 parts by weight of a cross linking monomer, 0.1~2 parts by weight of a visible light initiator, and 0.1~2 parts by weight of an additive.

An OLED device fabricating method according to another general aspect of the present embodiment includes: forming an adhesive layer on an upper surface of a plastic cover; and attaching the plastic cover to a board assembly, which is configured to include organic light emission elements, using the adhesive layer, wherein the adhesive layer is formed from an adhesive composition which includes 50~95 parts by weight of an acryl-based copolymer resin, 4.7~44 parts by weight of an acryl monomer, 0.1~2 parts by weight of a cross linking monomer, 0.1~2 parts by weight of a visible light initiator, and 0.1~2 parts by weight of an additive.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 1A:
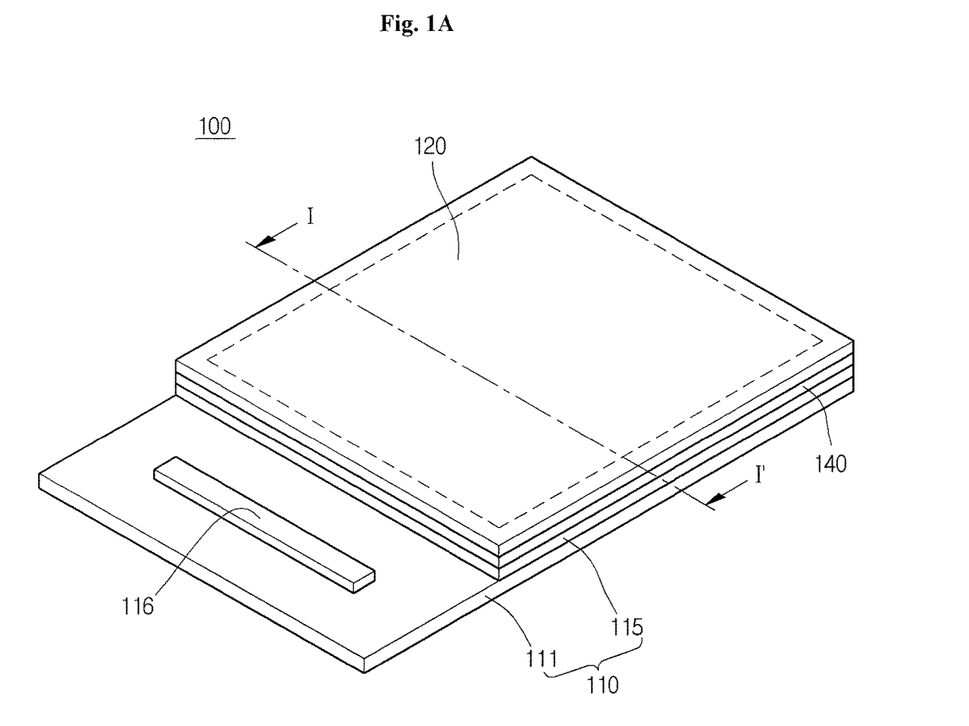
FIG. 1A is a perspective view schematically showing an OLED device according to a first embodiment of the present disclosure.
Figure 1B:
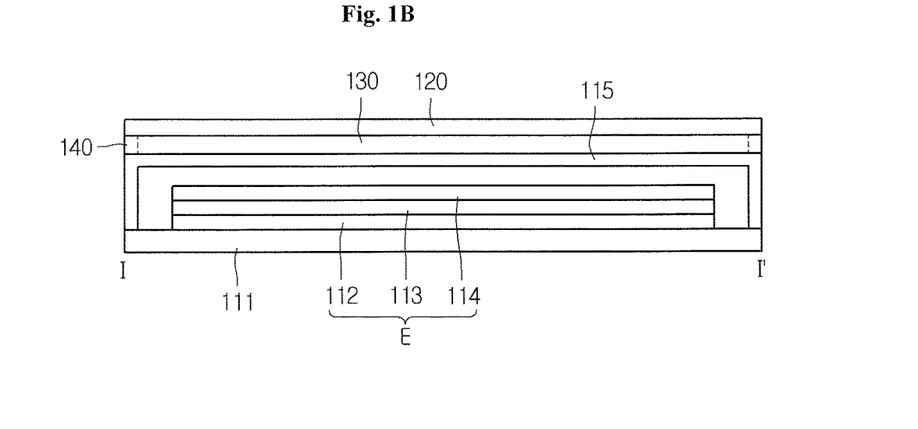
FIG. 1B is a cross-sectional view showing the sectional surface of the OLED device taken along a line I-I' of FIG. 1A.

FIG. 1A is a perspective view schematically showing an OLED device according to a first embodiment of the present disclosure. FIG. 1B is a cross-sectional view showing the sectional surface of the OLED device taken along a line I-I' of FIG. 1A.

Referring to FIGS. 1A and 1B, the OLED device 100 according to a first embodiment of the present disclosure can include a board assembly 110 configured to display an image by self-emitting light, a plastic cover 120 attached to the board assembly 110, and an adhesive layer 130 interposed between the board assembly 110 and the plastic cover 120.

The board assembly 110 can include organic light emission elements E arranged on a substrate 111, and a sealing substrate 115 disposed on the substrate 111 and configured to seal off the organic light emission elements E from the exterior. The substrate 111 can include a plurality of pixels each corresponding to a minimized unit which is defined to display the image. The organic light emission elements E can be disposed in the respective pixels.

The organic light emission element E can include a first electrode 112, an organic light emission layer 113 and a second electrode 114. The first electrode 112 can be used to apply first electrical charges to the organic light emission layer 113. Also, the first electrode 112 can be formed from a metal material in order to reflect light generated in the organic light emission layer 113. The organic light emission layer 113 enables exciters to be generated through the recombination of first and second electrical charges applied from the first and second electrodes 112 and 114. The exciters are transitioned in a basal state, thereby emitting light. In other words, the organic light emission layer 113 emits light. The color of light emitted from the organic light emission layer 113 can be selectively fixed according to the material forming the organic light emission layer 113.

The plurality of pixels can include the respective organic light emission elements profitable to display different colors from one another. A variety of color images can be provided to users by combination-driving the different color pixels from one another.

In order to enhance light emission efficiency, the organic light emission element E can further include at least one of a first electrical charge injection layer and a first electrical charge transport layer interposed between the first electrode 112 and the organic light emission layer 113. The first electrical charge injection layer and the first electrical charge transport layer can lower an energy barrier between the first electrode 112 and the organic light emission layer 113. In detail, the first electrical charge injection layer can help the electrical charges to be easily emitted from the first electrode 112 to the organic light emission layer 113. Also, the first electrical charge transport layer can be used to efficiently transfer the first electrical charges from the first electrode 112 to the organic light emission layer 113.

Also, the organic light emission element E can further include at least one of a first electrical charge suppression layer, a second electrical charge transport layer and a second electrical charge injection layer. The first electrical charge suppression layer can be used to prevent the first electrical charges from leaking in the organic light emission layer 113. The second electrical charge injection layer and the second electrical charge transport layer can lower an energy barrier between the second electrode 114 and the organic light emission layer 113. In detail, the second electrical charge injection layer can help the second electrical charges to be easily emitted from the second electrode 114 to the organic light emission layer 113. Also, the second electrical charge transport layer can be used to efficiently transfer the second electrical charges from the second electrode 114 to the organic light emission layer 113.

If the OLED device is an active type, each of the pixels can include a drive element electrically connected to the organic light emission element E which is not shown in the drawings. The drive element can include a switching thin film transistor, and a driving thin film transistor connected to the switching thin film transistor. The driving thin film transistor replies to an electrical signal transferred by the switching thin film transistor and controls a current signal flowing through the organic light emission element E. Further, each of the pixels can include a capacitor. The capacitor allows the driving thin film transistor to apply a constant amount of current to the organic light emission element E even though the switching thin film transistor is turn-off.

The sealing substrate 115 is combined with the substrate 111 including the organic light emission elements E and prevents the exposure of the organic light emission elements E to external oxygen or moisture. As such, the deterioration of the organic light emission elements E can be prevented. In other words, the sealing substrate 115 can have a function of sealing the organic light emission elements E on the substrate 111.

The OLED device 100 can further include a driver circuit 116 mounted to one edge of the substrate 111. The driver circuit 116 applies drive signals and power signals to the plurality of pixels. To this end, the driver circuit 116 can include a driver chip and a plurality of wirings.

Although it is shown and explained that the driver circuit 116 is loaded on the substrate 111, the present embodiment is not limited to this. The driver circuit can be electrically connected to the plurality of pixels through a flexible printed circuit board.

The plastic cover 120 can be attached to the board assembly 110 by means of the adhesive layer 130. Such a plastic cover 120 can be used to prevent the upper surface of the board assembly 110 which is exposed to the exterior.

The plastic cover 120 can include a UV blocker. As such, the deformation of the plastic cover 120 by external light, more particularly by UV light, can be prevented.

The adhesive layer 130 is filled between the board assembly 110 and the plastic cover 120 and attaches the plastic cover 120 to the upper surface of the board assembly 110.

The adhesive layer 130 can be formed from an adhesive composition which contains an acryl based copolymer resin, an acrylic monomer, an initiator, a cross linking monomer, and an additive.

The acryl based copolymer resin can contribute to the visibility (or visual reconizability) and the degree of hardening. To this end, the acryl based copolymer resin can have a polystyrene-converted weight-average molecular weight corresponding to a range of 2000~60000. If the weight-average molecular weight of the acryl based copolymer resin is less than 2000, a stain is generated due to a variation of contractibility. As such, the visibility (or the visual recognizability) can deteriorate. Meanwhile, when the weight-average molecular weight of the acryl based copolymer resin is more than 60000, solubility with respect to a solvent is reduced. Due to this, it is difficult to form a uniform film.

The acryl based copolymer resin can include at least one selected from a material group which includes an epoxy acrylate, a urethane acrylate resin, a polyester acrylate, a silicone acrylate resin, an amino acrylate resin, an epoxy methacrylate resin, a urethane methacrylate resin, a polyester methacrylate resin, a silicone methacrylate resin and an amino methacrylate resin.

The content of the acryl based copolymer resin can be in a range of about 50~96 parts by weight. If the content of the acryl based copolymer resin is less than 50 parts by weight, the adhesive composition has a very low viscosity index making it difficult to control the flow property. Also when the content of the acryl based copolymer resin is more than 96 parts by weight, it is difficult to control the flow of the adhesive composition having a very high viscosity index. In addition, air bubbles can be generated in the adhesive composition having the very high viscosity index. Due to these, tact time of a coating process can be lengthened.

In consideration of visibility and a coating property, the acryl monomer can be included in the adhesive composition within a range of 4.7~44 parts by weight. The acryl monomer can include at least one selected from a material group which consists of 2-butoxyethyl acrylate, 2-butoxyethyl methacrylate, 2-ethoxyethyl acrylate, 2-ethoxyethyl methacrylate, 2-ethyl-2-adamanthyl acrylate, 2-ethyl-2-adamanthyl methacrylate, 2-hydroxyethyl acrylate, 2-methyl-2-adamanthyl acrylate, 2-methyl-2-adamanthyl methacrylate, benzyl acrylate, cyclohexyl acrylate, di(ethyleneglycol) ethylether acrylate, di(ethyleneglycol)ethylether methacrylate, di(ethylene glycol)methylether methacrylate, dicyclofentanyl acrylate, epoxy acrylate, ethylene glycol methyl ether acrylate, ethylene glycol phenyl ether acrylate, hydroxypropyl acrylate, isobornyl acrylate, methyl adamanthyl arcylate, neopentyl glycol benzoate acrylate, 2-hydroxymethyl methacrylate, adamanthyl methacrylate, alkyl methacrylate, benzyl methacrylate, cyclohexyl methacrylate, dicyclopentanyl methacrylate, epoxycyclohexylmethyl methacrylate, ethylene glycol phenyl ether methacrylate, hydroxylbutyl methacrylate, hydroxypropyl methacrylate, isobornyl methacrylate, glycidyl methacrylate, methyl adamanthyl methacrylate, methyl methacrylate, methyl glycidyl methacrylate, isobutyl acrylate, tert-butyl acrylate, lauryl acrylate, alkyl acrylate, 2-hydroxy acrylate, trimethoxybutyl acrylate, ethyl carbitol acrylate, phenoxyethyl acrylate, 4-hydroxybutyl acrylate, 2-hydroxy-3-phenoxypropyl acrylate, 3-fluoroethyl acrylate, 4-fluoropropyl acrylate, and triethyl siloxyl ethyl acrylate.

The initiator can be included into the adhesive composition in a range of 0.1~2 parts by weight, in order to consider an adhesion strength, visibility and the index of hardening. The initiator can be a visible light initiator for initiating and inducing photopolymerization in the visible light range. As an example of the visible light initiator, one of camphor quinone peroxyester and 9-fluorene carboxylic acid peroxyester can be used.

Also, the initiator can include a photo-initiator for initiating and induce the photopolymerization in a range of both UV and visible lights. For example, the photoinitiator can become one of a ketone-based compound, an acetophenone-based compound, a benzoinphenone-based compound, a thioxanthone-based compound, a benzoin-based compound and a triazine-based compound. The ketone-based compound can include 1-hydroxycyclohexyl phenyl ketone. As an example of the acetophenone-based compound, one of 2,2'-diethoxy acetophenone, 2,2'-dibuthoxy acetophenone, 2-hydroxy-2-methyl propiophenone, p-t-butyltrichloroacetophenone, p-t-butyldichloroacetophenone, 4-chloroacetophenone, 4,4'-dimethylaminobenzophenone, 4,4'-dichlorobenzophenone, 3,3'-dimethyl-2-methoxybenzophenone, 2'2-dichloro-4-phenoxyacetophenone, 2-methyl-1-(4-(methyltio)phenyl)-2-morpholinopropane-1-one and 2-benzyl-2-dimethylamino-1-(4-morpholinophenyl)-butane-1-one can be used. The benzophenone-based compound can become one of benzophenone, benzoylbenzoic acid, benzoylbenzoic acid methyl, 4-phenylbenzophenone, hydroxyl benzophenone, an acrylated benzophenone, 4,4'-bis(dimethyl amino)benzophenone and 4,4'-bis(diethyl amino)benzophenone. The thioxanthone-based compound can become one of thioxanthone, 2-chrol thioxanthone, 2-methylthioxanthone, isopropyl thioxanthone, 2,4-diethyl thioxanthone, 2,4-diisopropyl thioxanthone and 2-chloro thioxanthone. As an example of the benzoin-based compound, one of benzoin, benzoin methyl ether, benzoin ethyl ether, benzoin isopropyl ether, benzoin isobutyl ether and benzyl dimethyl ketal can be used. The triazine-based compound can become one of 2,4,6-trichloro s-triazine, 2-phenyl 4,6-bis(trichloro methyl)-s-triazine, 2-(3',4'-dimethoxy styryl)-4,6-bis(tricloro methyl)-s-triazine, 2-(4'-methoxy naphthyl)-4,6-bis (trichloro methyl)-s-triazine, 2-(p-methoxy phenyl)-4,6-bis (trichloro methyl)-s-triazine, 2-(p-thryl)-4,6-bis(trichloro methyl)-s-triazine, 2-phenyl 4,6-bis(trichloro methyl)-s-triazine, bis(trichloro methyl)-6-stiryl s-triazine, 2-(naphto 1-yl)-4,6-bis(tricloro methyl)-s-triazine, 2-(4-methoxy naphto 1-yl)-4,6-bis(trichloro methyl)-s-triazine, 2-4-trichloro methyl(piperonyl)-6-triazine and 2-4-trichloro methyl(4'-methoxy stiryl)-6-triazine.

The cross linking monomer can be included in the adhesive composition within a content range of 0.1~2 parts by weight, in order to consider the visibility and the index-of hardening. The cross linking monomer can have a double bond in the chemical structure formula. As an example of the cross linking monomer, one of 1,4-butanediol diacrylate, 1,6-hexanediol diacrylate, 1,3-butylene glycol diacrylate, neopenthyl glycol diacrylate, ethylene glycol diacrylate, diethylene glycol diacrylate, prophylene glycol dimethacrylate, pentaerythritol tetraacrylate, pentaerythritol diacrylate, pentaerythritol triacrylate, dipentaerythritol triacrylate, dipentaerythritol pentaacrylate, dipentaerythritol hexadiacrylate, triethylene glycol diacrylate, polyethylene glycol diacrylate, dipentaerythritol arcylate, sorbitol triacrylate, bisphenol A diacrylate and trimethylolpropane triacrylate can be used.

In addition, the adhesive composition can include a silane coupling agent able to enhance the adhesion strength as an additive. The additive can be included into the adhesive composition within a content range of 0.1~2 parts by weight. The silane coupling agent can become one of 2-(3,4 epoxycyclohexyl)-ethyltrimethoxysilane containing epoxy, 3-glycidoxy trimethoxy silane, 3-glycidoxy propyl trimethoxy silane, N-2(aminoethyl)-3-aminopropylmethyldimethoxysilane, N-2(aminoethyl)-3-aminopropyltrimethoxysilane, N-2 (aminoethyl)-3-aminopropyltriethoxysilane, 3-aminopropyltrimethoxysilane, 3-aminopropyltriethoxysilane, 3-triethoxysily-N-(1,3-dimethylbutylidene)propylamine, N-phenyl-3-aminopropyltrimethoxysilane, 3-mercaptopropylmethyldimethoxysilane, 3-mercaptopropyltriethoxysilane and 3-isocyanatepropyltriethoxysilane containing isocyanate. N-2(aminoethyl)-3-aminopropylmethyldimethoxysilane, N-2(aminoethyl)-3-aminopropyltrimethoxysilane, N-2(aminoethyl)-3-aminopropyltriethoxysilane, 3-aminopropyltrimethoxysilane, 3-aminopropyltriethoxysilane, 3-triethoxysily-N-(1,3-dimethylbutylidene)propylamine and N-phenyl-3-aminopropyltrimethoxysilane each contain amine radicals. 3-mercaptopropylmethyldimethoxysilane and 3-mercaptopropyltriethoxysilane each contain isocyanate.

Such an adhesive layer 130 is completely filled into the air gap unlike that of the related art, thereby preventing the deterioration of visibility (or visual recognizability) due to the air gap. The adhesion strength between the plastic cover 120 and the board assembly 110 increases because the adhesive layer 130 is filled into the entire space (or gap) between the plastic cover 120 and the board assembly 110. Also, the adhesive layer 130 including the visible light initiator can initiate polymerization of the adhesive composition even though the plastic cover 120 includes the UV blocker. As such, the deterioration of adhesion strength due to incomplete hardening of the adhesive composition can be prevented.

Also, the adhesive layer 130 filled between the board assembly 110 and the plastic cover 120 can disperses an external impact. In accordance therewith, the board assembly 110 or the plastic cover 120 can be protected from a directly or intensively external impact.

Furthermore, the OLED device 100 can include a dam 140 formed along edges of the upper surface of the board assembly 110. The dam 140 can prevent the adhesive composition from flowing to any other area except the upper surface of the board assembly 110 when a coating process of the adhesive composition for the formation of the adhesive layer 130 is performed. Such a dam 140 can be formed from the same material as the adhesive composition.

It is explained that the board assembly 110 includes the organic light emission elements E of a top-emission type which emit light toward the sealing substrate 115 and the plastic cover 120 is disposed on the sealing substrate 115, but the embodiment of the present disclosure is not limited to this. Alternatively, the board assembly 110 can include organic light emission elements of a bottom emission type which emit light toward the substrate 111. In this case, the plastic cover 120 can be attached to the substrate 111.

In this manner, the embodiment of the present disclosure enables the adhesive layer 130 to be completely filled between the board assembly 110 and the plastic cover 120. Therefore, the OLED device 100 can simultaneously secure impact-resistibility and visibility. In addition, the adhesion strength between the board assembly 110 and the plastic cover 120 can be enhanced.

FIGS. 2 through 5 are perspective views illustrating an OLED device fabrication method according to a second embodiment of the present disclosure.

Figure 2:
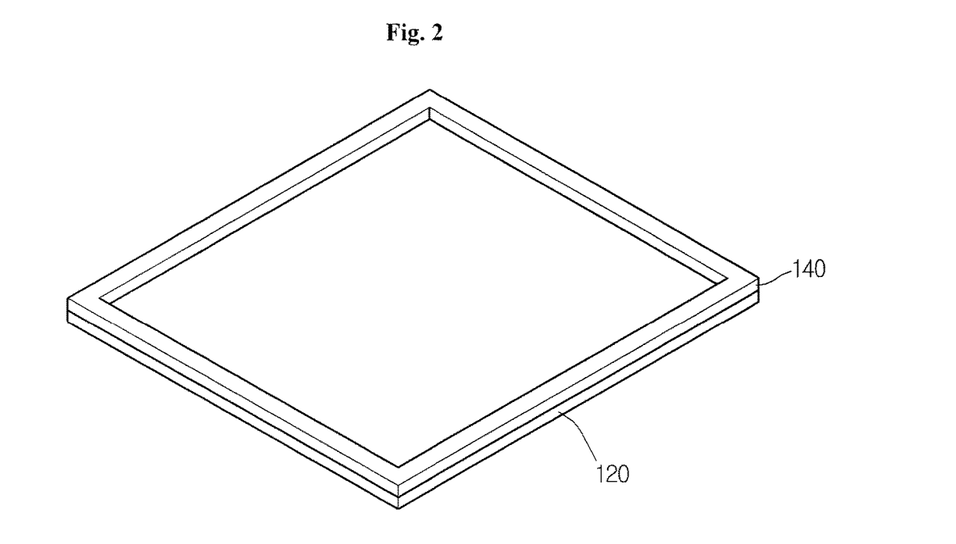
FIGS. 2 through 5 are perspective views illustrating an OLED device fabrication method according to a second embodiment of the present disclosure.

Referring to FIG. 2, a plastic cover 120 is first prepared to fabricate an OLED device. The plastic cover 120 can be used to protect a board assembly which can be exposed to the exterior. The plastic cover 120 can include a UV blocker.

A dam 140 is formed along edges of the upper surface of the plastic cover 120. The dam 140 can be used to limit the flowing of an adhesive composition 130a, which will be described later, within the upper surface of the plastic cover 120.

In order to form the dam 140, the above-mentioned adhesive composition 130a is coated along the edges of the plastic cover 120 through a dispenser coating process. Subsequently, the coated adhesive composition is provisionally hardened by being exposed to UV rays, thereby forming the dam 140. Alternatively, the dam 140 can be formed using one of an inkjet printing method, an imprinting method, a roll printing method, a screen coating method and so on.

Figure 3:
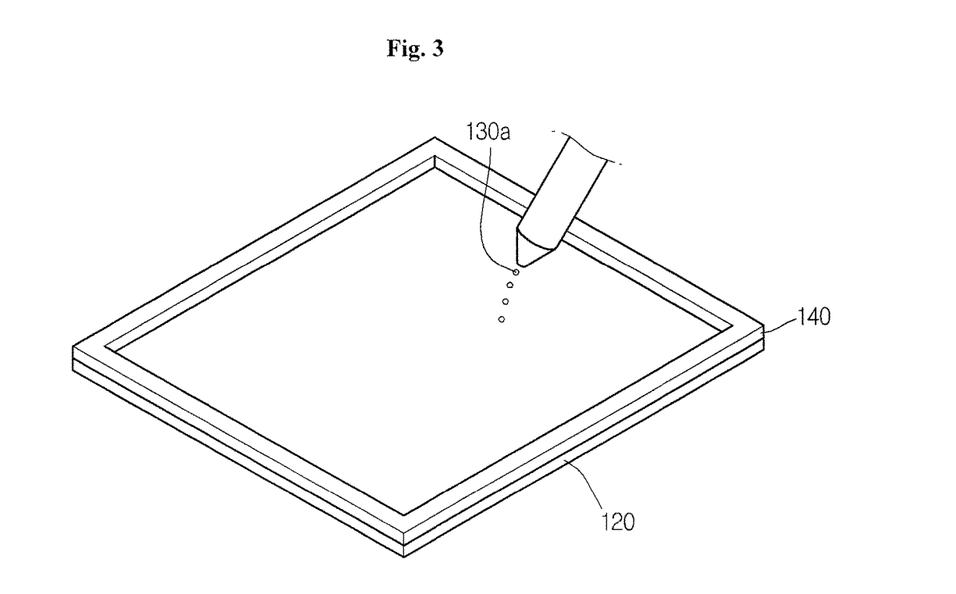

After the dam 140 is formed, the above-mentioned adhesive composition 130a is recoated on the upper surface of the plastic cover 120 which is defined by the dam 140, as shown in FIG. 3. The recoating process of the adhesive composition 130a can be performed using a dispenser coating method. At this time, the flowing of the adhesive composition 130a is limited by the dam 140 within the upper surface of the plastic cover 120. As such, contamination of any other area except the upper surface of the plastic cover 120 can be prevented.

The recoating process of the adhesive composition 130a is not limited to the dispenser coating method. In other words, the recoating process of the adhesive composition 130a can be performed using one of a spin coating method, a screen coating method, an inkjet printing method, a roll printing method, and an imprinting method and so on.

Figure 4:
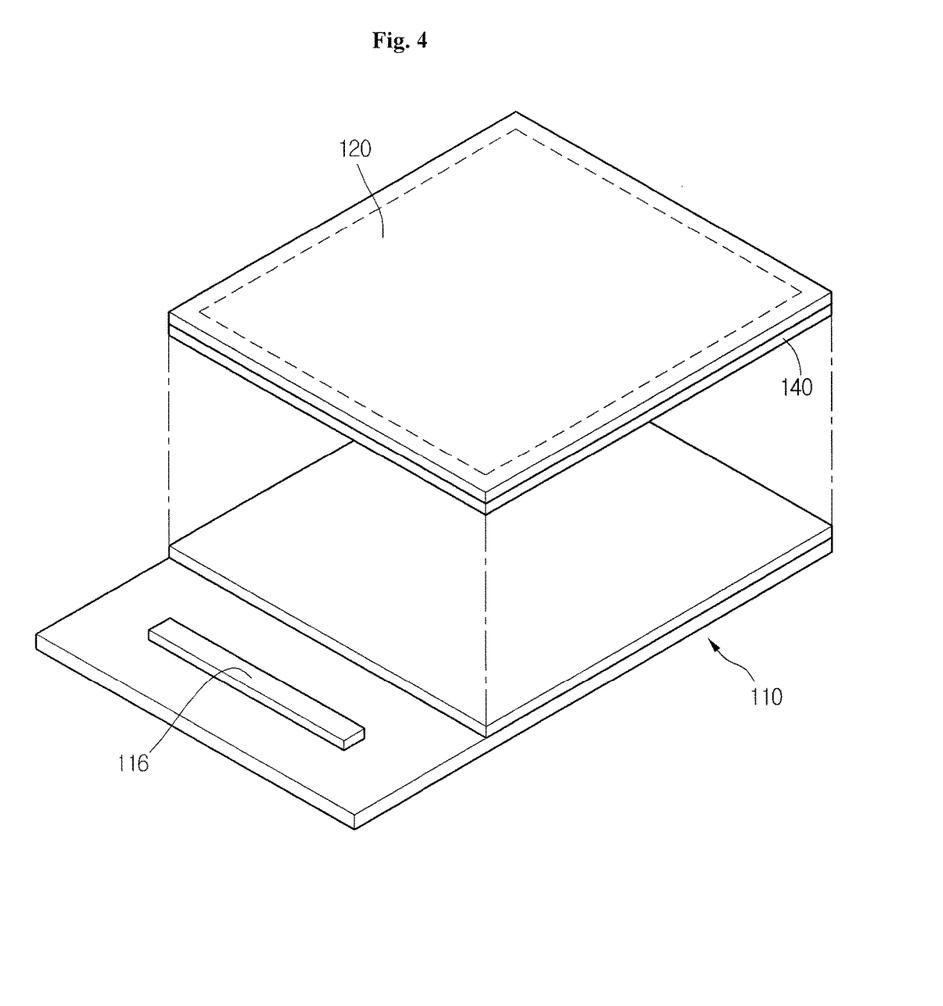

Meanwhile, a board assembly 110 is prepared as shown in FIG. 4. The board assembly 110 can include organic light emission elements E arranged on a substrate 111 and a sealing substrate 115 disposed on the substrate 111. The sealing substrate 115 is combined with the substrate 111 in such a manner as to cover the organic light emission elements E. As such, the sealing substrate 115 can have a function of preventing the organic light emission elements E from intrusion of external moisture and oxygen. Moreover, a driver circuit 116 can be loaded on the upper surface of the substrate 111, but the embodiment of the present disclosure is not limited to this. Alternatively, the driver circuit 116 can be electrically connected to elements, for example drive elements or the organic light emission elements E, on the substrate 111 through a flexible PCB (printed circuit board).

Such a plastic cover 120 coated with the adhesive composition 130a is aligned on the board assembly 110.

Figure 5:
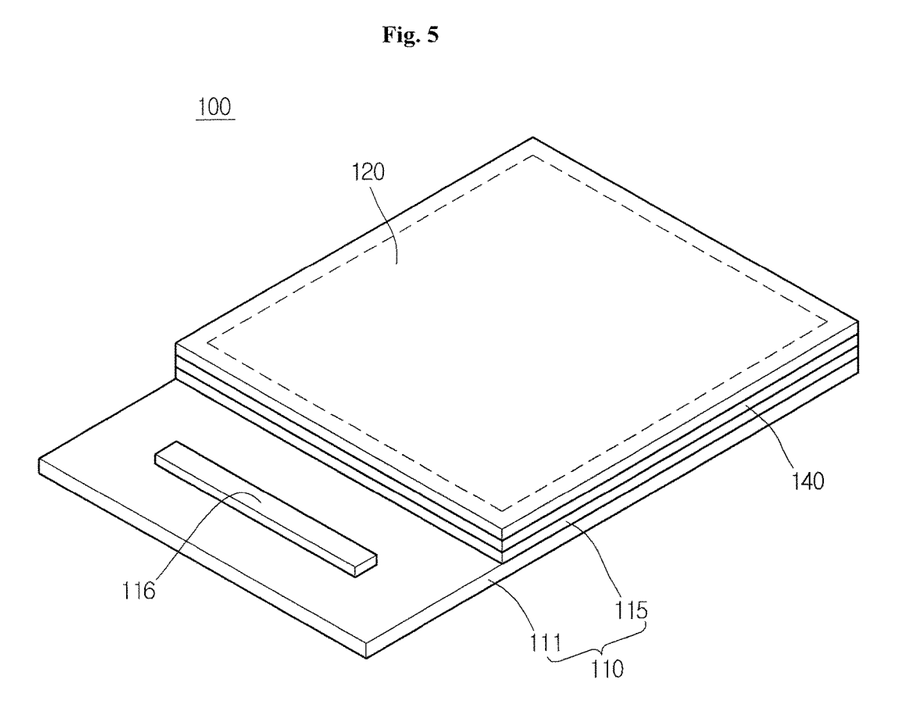

Referring to FIG. 5, there is provided a waiting period after the above-mentioned alignment process, in order to uniformly diffuse the adhesive composition 130a throughout the entire space (or gap) between the board assembly 110 and the plastic cover 120. When the adhesive composition 130a is uniformly diffused between the board assembly 110 and the plastic cover 120, visible light is irradiated on the board assembly 110 or the plastic cover 120 and enables the adhesive composition 130a to be provisionally hardened. Alternatively, this provisional hardening process can be performed using a metal halide lamp which emits light in a UV and visible wavelength range.

After the adhesive composition 130a is provisionally hardened, an autoclave process and a visual inspection are sequentially performed for the board assembly 110 combined with the plastic cover 120. If any defect is not detected, the adhesive composition 130a is re-hardened by visible light so that an adhesive layer is formed. Alternatively, the re-hardening process is also performed using a metal halide lamp which emits light in a UV and visible wavelength range.

The adhesive composition 130a including the visible light initiator can initiate polymerization even though the plastic cover 120 includes the UV blocker. As such, incomplete hardening of the adhesive composition can be prevented.

The autoclave process is used to remove air bubbles generated in the provisionally hardened adhesive-compound 130a. Also, the visual inspection is done to check whether or not any foreign material or an air bubble exists in the provisionally hardened adhesive composition 130a. The autoclave process and the visual inspection can be alerted to each other in the sequence.

In this way, the embodiment of the present disclosure allows the adhesive composition 130s to be filled and hardened between the board assembly 110 and the plastic cover 120. In accordance therewith, the adhesive layer 130 filled between the board assembly 110 and the plastic cover 120 can be formed.

Hereinafter, the adhesive layer fabrication method according to an embodiment of the present disclosure will be explained referring to experimental samples below. The experimental samples below are only used to explain the present embodiment. As such, the present embodiment is not limited to the experimental samples below.

Experimental Sample 1

The adhesive composition according to the experimental sample 1 is fabricated by uniformly mixing: 80 parts by weight of an urethane acrylate, which has a polystyrene-converted weight-average molecular weight of 20,000, as an acryl-based copolymer resin; 18 parts by weight of isobornyl acrylate as an acryl monomer; 0.5 part by weight of dipentaerythritol triacrylate as a cross linking monomer; a mixture of 0.5 part by weight of 1-hydroxycyclohexyl phenyl ketone and 0.5 part by weight of camphor quinine peroxyester as an initiator; and 0.5 part by weight of 3-glycidoxy propyl trimethoxy silane as an additive, at the normal temperature during at least 24 hours.

Experimental Sample 2

The adhesive composition according to the experimental sample 2 is fabricated by uniformly mixing: 85 parts by weight of an urethane acrylate, which has a polystyrene-converted weight-average molecular weight of 50,000, as an acryl-based copolymer resin; 13 parts by weight of 2-ethoxyethyl acrylate as an acryl monomer; 1 part by weight of dipentaerythritol triacrylate as a cross linking monomer; a mixture of 0.5 part by weight of 1-hydroxycyclohexyl phenyl ketone and 0.5 part by weight of camphor quinine peroxyester as an initiator; and 0.5 part by weight of 3-glycidoxy propyl trimethoxy silane as an additive, at the normal temperature during at least 24 hours.

Comparable Sample 1

The adhesive composition of the comparable sample 1 is fabricated by uniformly mixing: 40 parts by weight of epoxy acrylate as an acryl-based copolymer resin; 58 parts by weight of isobornyl acrylate as an acryl monomer; 0.5 part by weight of dipentaerythritol triacrylate as a cross linking monomer; 1 part by weight of 1-hydroxycyclohexyl phenyl ketone as an initiator; and 0.5 part by weight of 3-glycidoxy propyl trimethoxy silane as an additive, at the normal temperature during 24 hours.

Comparable Sample 2

The adhesive composition of the comparable sample 2 is fabricated by uniformly mixing: 30 parts by weight of silicon acrylate as an acryl-based copolymer resin; 68 parts by weight of 2-ethoxyethyl acrylate as an acryl monomer; 1 part by weight of dipentaerythritol triacrylate as a cross linking monomer; 0.5 part by weight of 1-hydroxycyclohexyl phenyl ketone as an initiator; and 0.5 part by weight of 3-glycidoxy propyl trimethoxy silane as an additive, at the normal temperature during 24 hours.

Such fabricated adhesive compositions are tested for the following items.

A) Hardening index

Each of the fabricated adhesive compositions is coated and hardened on the plastic cover. Subsequently, the plastic cover provided with the hardened adhesive composition is dipped in tetrahydrofurane, which is a solvent, during at least 24 hours. Thereafter, non-dissolved polymers are extracted using a filter and dried for a fixed period. Therefore, the hardening index can be estimated as follow:

Gel contents(%)=$Wb/Wa$×100

Wherein, "Wa" is a weight of the hardened adhesive composition, and "Wb" is a weight of the extracted and dried polymers.

B) Transmittance

Each of the fabricated adhesive compositions is coated on the plastic cover in the thickness of 150 μm and hardened by being exposed to UV light, thereby providing experimental plates. The transmittance for each of the experimental plates can be measured using an UV-vis spectrometer.

C) Adhesion Strength

Each of the fabricated adhesive compositions is coated on the plastic cover in the thickness of 150 μm. Subsequently, the plastic covers coated with the respective adhesive compositions are combined with glass substrates, thereby providing experimental plates. The adhesion strength for each experimental plate can be measured with an UTM (Universal Testing Machine). The adhesion dimension is set to be 1 cm², and the speed is set to be 300 mm/min.

Table 1 below represents experimental resultants for the fabricated adhesive compositions.

TABLE 1

|  | Experimental sample 1 | Experimental sample 1 | Comparable sample 1 | Comparable sample 2 |
| --- | --- | --- | --- | --- |
| Hardening index (%) | 93 | 93 | 58 | 55 |
| Trnasmittance % (at 400 nm) | 99 | 99 | 98 | 96 |
| Adhesion strength (kgf/cm²) | 8 | 5 | 0.9 | 0.5 |

As seen from table 1, it is evident that the experimental samples 1 and 2 have hardening index, transmittance and adhesion strength higher than those of the comparable samples 1 and 2. In detail, since the experimental samples 1 and 2 each include a visible light initiator, the experimental samples 1 and 2 can have higher hardening index and adhesion strength compared to the comparable samples 1 and 2.

As described above, the embodiments of the present disclosure enables the adhesive layer to be completely filled between the board assembly and the plastic cover. Therefore, the adhesion strength between the board assembly and the plastic cover can be enhanced. Also, the OLED device can simultaneously secure impact-resistibility and visibility.

Moreover, the adhesive composition according to the embodiment of the present disclosure includes the light initiator. As such, incomplete hardening of the adhesive layer can be prevented. In accordance therewith, the adhesion strength between the board assembly and the plastic cover can be more enhanced.

Furthermore, according to the embodiment of the present disclosure, the adhesive layer filled between the board assembly and the plastic cover can disperses an external impact. Therefore, damages of the OLED device caused by the external impact can be reduced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. An organic light emitting display device comprising:
a board assembly including organic light emission elements arranged on a substrate, and a sealing member on the substrate to seal the organic light emission elements;
a plastic cover including an ultra violet light blocker on the board assembly; and
an adhesive layer between the board assembly and the plastic cover, disposed on the sealing member, and attaching the plastic cover to an upper surface of the sealing member, and formed from an adhesive composition which includes 50~95 parts by weight of an acryl-based copolymer resin, 4.7~44 parts by weight of an acryl monomer, 0.1~2 parts by weight of a cross linking monomer, 0.1~2 parts by weight of a visible light initiator, and 0.1~2 parts by weight of an additive; and a dam formed from the same material as the adhesive layer, wherein the dam is directly adjacent to and is along edges of the adhesive layer.

2. The organic light emitting display device of claim 1, wherein the acryl-based copolymer resin has a polystyrene-converted weight-average molecular weight of a range of 2,000~50,000.

3. The organic light emitting display device of claim 2, wherein the acryl-based copolymer resin includes at least one selected from a material group consisting of a polyester acrylate resin, a silicone acrylate resin, an amino acrylate resin, an epoxy methacrylate resin, a polyester methacrylate resin, a silicone methacrylate resin and an amino methacrylate resin.

4. The organic light emitting display device of claim 1, wherein the acryl monomer includes at least one selected from a material group which consists of 2-butoxyethyl acrylate, 2-butoxyethyl methacrylate, 2-ethoxyethyl acrylate, 2-ethoxyethyl methacrylate, 2-ethyl-2-adamanthyl acrylate, 2-ethyl-2-adamanthyl methacrylate, 2-hydroxyethyl acrylate, 2-methyl-2-adamanthyl acrylate, 2-methyl-2-adamanthyl methacrylate, benzyl acrylate, cyclohexyl acrylate, di(ethyleneglycol)ethylether acrylate, di(ethyleneglycol)ethylether methacrylate, di(ethylene glycol)methylether methacrylate, dicyclofentanyl acrylate, ethylene glycol methyl ether acrylate, ethylene glycol phenyl ether acrylate, hydroxypropyl acrylate, methyl adamanthyl acrylate, neopentyl glycol benzoate acrylate, 2-hydroxymethyl methacrylate, adamanthyl methacrylate, benzyl methacrylate, cyclohexyl methacrylate, dicyclopentanyl methacrylate, epoxycyclohexylmethyl methacrylate, ethylene glycol phenyl ether methacrylate, hydroxylbutyl methacrylate, hydroxypropyl methacrylate, methyl adamanthyl methacrylate, methyl glycidyl methacrylate, tert-butyl acrylate, 2-hydroxy acrylate, trimethoxybutyl acrylate, ethyl carbitol acrylate, 4-hydroxybutyl acrylate, 2-hydroxy-3-phenoxypropyl acrylate, 3-fluoroethyl acrylate, 4-fluoropropyl acrylate, and triethyl siloxyl ethyl acrylate.

5. The organic light emitting display device of claim 1, wherein the adhesive composition further includes a photo initiator for initiating and inducing photopolymerization in an ultra violet and visible light range.

6. The organic light emitting display device of claim 5, wherein the photo initiator includes one of a ketone-based compound, an acetophenone-based compound, a benzoinphenone-based compound, a thioxanthone-based compound, a benzoin-based compound and a triazine-based compound.

7. The organic light emitting display device of claim 5, wherein the photo initiator does not include a benzophenone or a benzoin-based compound.

8. The organic light emitting display device of claim 1, wherein the visible light initiator includes one of camphor quinine peroxyester and 9-fluorene carboxylic acid peroxyester.

9. The organic light emitting display device of claim 1, wherein the additive is a silane coupling agent selected from the group consisting of N-2(aminoethyl)-3-aminopropyltrimethoxysilane, N-2(aminoethyl)-3-aminopropyltriethoxysilane, 3-triethoxysily-N-(1,3-dimethylbutylidene)propylamine, 3-mercaptopropylmethyldimethoxysilane, 3-mercaptopropyltriethoxysilane and 3-isocyanatepropyltriethoxysilane containing isocyanate.

10. A method of fabricating an organic light emitting display device, the method comprising:
forming a dam along edges of an upper surface of a plastic over including an ultra violet light blocker;
forming an adhesive layer on an upper surface of the plastic cover; and
attaching the plastic cover to a board assembly including organic light emission elements arranged on a substrate, and a sealing member on the substrate to seal the organic light emission elements, using the adhesive layer,
wherein the adhesive layer is disposed on the sealing member, and attaching the plastic cover to an upper surface of the sealing member, and formed from an adhesive composition which includes 50~95 parts by weight of an acryl-based copolymer resin, 4.7~44 parts by weight of an acryl monomer, 0.1~2 parts by weight of a cross linking monomer, 0.1~2 parts by weight of a visible light initiator, and 0.1~2 parts by weight of the additive.

11. The method of claim 10, wherein the acryl-based copolymer resin has a polystyrene-converted weight-average molecular weight of a range of 2,000~50,000.

12. The method of claim 11, wherein the acryl-based copolymer resin includes at least one selected from a material group which includes an epoxy acrylate, a urethane acrylate resin, a polyester acrylate resin, a silicone acrylate resin, an amino acrylate resin, an epoxy methacrylate resin, a urethane methacrylate resin, a polyester methacrylate resin, a silicone methacrylate resin and an amino methacrylate resin.

13. The method of claim 10, further comprising
coating the adhesive composition on the upper surface of the plastic cover before the formation of the adhesive layer.

14. The method of claim 10, wherein the adhesive composition further includes a photo initiator for initiating and inducing photopolymerization in an ultra violet and visible light range.

15. The method of claim 10, wherein the acryl monomer includes at least one selected from a material group which consists of 2-butoxyethyl acrylate, 2-butoxyethyl methacrylate, 2-ethoxyethyl acrylate, 2-ethoxyethyl methacrylate, 2-ethyl-2-adamanthyl acrylate, 2-ethyl-2-adamanthyl methacrylate, 2-hydroxyethyl acrylate, 2-methyl-2-adamanthyl acrylate, 2-methyl-2-adamanthyl methacrylate, benzyl acrylate, cyclohexyl acrylate, di(ethyleneglycol)ethylether acrylate, di(ethyleneglycol)ethylether methacrylate, di(ethylene glycol)methylether methacrylate, dicyclofentanyl acrylate, epoxy acrylate, ethylene glycol methyl ether acrylate, ethylene glycol phenyl ether acrylate, hydroxypropyl acrylate, methyl adamanthyl arcylate, neopentyl glycol benzoate acrylate, 2-hydroxymethyl methacrylate, adamanthyl methacrylate, alkyl methacrylate, benzyl methacrylate, cyclohexyl methacrylate, dicyclopentanyl methacrylate, epoxycyclohexylmethyl methacrylate, ethylene glycol phenyl ether methacrylate, hydroxylbutyl methacrylate, hydroxypropyl methacrylate, isobornyl methacrylate, glycidyl methacrylate, methyl adamanthyl methacrylate, methyl glycidyl methacrylate, tert-butyl acrylate, 2-hydroxy acrylate, trimethoxybutyl acrylate, ethyl carbitol acrylate, phenoxyethyl acrylate, 4-hydroxybutyl acrylate, 2-hydroxy-3-phenoxypropyl acrylate, 3-fluoroethyl acrylate, 4-fluoropropyl acrylate, and triethyl siloxyl ethyl acrylate.

\* \* \* \* \*